(12) United States Patent
Adusumilli et al.

(10) Patent No.: US 10,090,151 B2
(45) Date of Patent: Oct. 2, 2018

(54) STRUCTURE AND METHOD TO REDUCE COPPER LOSS DURING METAL CAP FORMATION

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/906,956

(22) Filed: Feb. 27, 2018

(65) Prior Publication Data

US 2018/0190592 A1 Jul. 5, 2018

Related U.S. Application Data

(62) Division of application No. 15/229,783, filed on Aug. 5, 2016, now Pat. No. 9,947,621.

(51) Int. Cl.
*H01L 21/02* (2006.01)
*H01L 21/283* (2006.01)
(Continued)

(52) U.S. Cl.
CPC .. *H01L 21/02362* (2013.01); *H01L 21/02304* (2013.01); *H01L 21/283* (2013.01);
(Continued)

(58) Field of Classification Search
CPC ......... H01L 21/02304; H01L 21/02362; H01L 21/76838; H01L 21/76841; H01L 21/76843; H01L 21/76846; H01L 21/76847; H01L 21/76849; H01L 21/7685; H01L 21/76855; H01L 21/76877; H01L 21/76882; H01L 21/76883; H01L 23/5226; H01L 23/53228; H01L 23/53233; H01L 23/53238

See application file for complete search history.

(56) References Cited

U.S. PATENT DOCUMENTS 6,268,291 B1 7/2001 Andricacos et al.
6,703,307 B2 3/2004 Lopatin et al.
(Continued)

OTHER PUBLICATIONS

Peethala, B.C. et al., "Controlling the Galvanic Corrosion of copper during CMP of Ruthenium barrier films", Solid-State Letters, May 2011, pp. H306-H310, 14 (7).
(Continued)

*Primary Examiner* — Eduardo A Rodela
(74) *Attorney, Agent, or Firm* — Scully, Scott, Murphy & Presser, P.C.; Daniel P. Morris, Esq.

(57) ABSTRACT

A copper or copper alloy is formed in a reflow enhancement layer lined opening present in an interconnect dielectric material layer. A ruthenium (Ru) or osmium (Os) doped copper or copper alloy cap is then formed via ion implantation and annealing in an upper portion of a copper or copper alloy present in the opening. The upper portion of the copper or copper alloy containing the ruthenium (Ru) or osmium (Os) doped copper or copper alloy cap can mitigate or even present prevent preferential loss of copper which can aid in lowering the interconnect resistance of the structure.

19 Claims, 3 Drawing Sheets

(51) Int. Cl.
   *H01L 23/522* (2006.01)
   *H01L 23/532* (2006.01)
   *H01L 21/321* (2006.01)
   *H01L 21/768* (2006.01)
   *H01L 21/288* (2006.01)
   *H01L 21/285* (2006.01)

(52) U.S. Cl.
   CPC ...... *H01L 21/2855* (2013.01); *H01L 21/2885* (2013.01); *H01L 21/32115* (2013.01); *H01L 21/7685* (2013.01); *H01L 21/76838* (2013.01); *H01L 21/76841* (2013.01); *H01L 21/76843* (2013.01); *H01L 21/76846* (2013.01); *H01L 21/76847* (2013.01); *H01L 21/76849* (2013.01); *H01L 21/76855* (2013.01); *H01L 21/76858* (2013.01); *H01L 21/76859* (2013.01); *H01L 21/76871* (2013.01); *H01L 21/76877* (2013.01); *H01L 21/76882* (2013.01); *H01L 21/76883* (2013.01); *H01L 23/5226* (2013.01); *H01L 23/532* (2013.01); *H01L 23/53204* (2013.01); *H01L 23/53209* (2013.01); *H01L 23/53228* (2013.01); *H01L 23/53233* (2013.01); *H01L 23/53238* (2013.01); *H01L 23/53266* (2013.01)

(56) References Cited

U.S. PATENT DOCUMENTS

| | | |
|---|---|---|
| 8,586,473 B1 | 11/2013 | Tanwar et al. |
| 8,603,913 B1 | 12/2013 | Li et al. |
| 2006/0251872 A1 | 11/2006 | Wang et al. |
| 2008/0296768 A1 | 12/2008 | Chebiam et al. |
| 2010/0015800 A1 | 1/2010 | Hara et al. |
| 2013/0140698 A1 | 6/2013 | Lakshmanan et al. |
| 2013/0270703 A1 | 10/2013 | Lierath et al. |
| 2014/0187036 A1 | 7/2014 | Tanwar |

OTHER PUBLICATIONS

Sagi, K. V., et al., "Potassium Permanganate-Based Slurry to Reduce the Galvanic Corrosion of the Cu/Ru/TiN Barrier Liner Stack during CMP in the BEOL Interconnects", ECS Journal of Solid State Science and Technology, Feb. 2016, pp. P256-P263, 5(5).

Victoria, S. N., et al., "Chemical Mechanical Planarization of Ruthenium with Oxone as Oxidizer", Electrochemical and Solid-State Letters, Dec. 2011, pp. H55-H58, 15 (3).

Shi, T., et al., "Electrochemical Characterizations and CMP Performance of Ru Slurry". ECS Transactions, Jun. 2013, pp. 17-27, 50(39).

Cheng, J., et al., "Synergetic effect of potassium molybdate and benzotriazole on the CMP of RU and CU in KIO4-based slurry", Applied Surface Science Nov. 2014, pp. 531-537, 320.

List of IBM Patents or Patent Applications Treated as Related dated Feb. 27, 2018, 2 pages.

STRUCTURE AND METHOD TO REDUCE COPPER LOSS DURING METAL CAP FORMATION

BACKGROUND

The present application relates to a semiconductor structure and a method of forming the same. More particularly, the present application relates to a semiconductor structure including an interconnect dielectric material layer containing an embedded copper or copper alloy in which an upper portion of the copper or copper alloy has been modified to mitigate or prevent preferential loss of copper. The modified upper portion of the copper or copper alloy, which is formed in part by ion implantation of a dopant metal, can aid in lowering the interconnect resistance of the structure.

Aggressive scaling has exposed limitations of extending the conventional copper plating process to advanced technology nodes. Dissolution of copper seed layers in the electroplating bath and sidewall voiding are some of the challenges with the conventional approach. Introduction of a thin ruthenium reflow enhancement layer has helped to mitigate these challenges and enables a plating-based or high temperature physical vapor deposition copper approach for interconnect metallization.

However, during the planarization of the ruthenium enhancement layer by chemical mechanical polishing (CMP), preferential loss of significant amounts of copper is observed and has been attributed to galvanic corrosion. This leads to a significant increase in the interconnect line and via resistance. As such, there is a need for providing a structure and a method to mitigate or prevent preferential loss of copper which can help lower the interconnect resistance.

SUMMARY

A copper or copper alloy is formed in a reflow enhancement layer lined opening present in an interconnect dielectric material layer. A ruthenium (Ru) or osmium (Os) doped copper or copper alloy cap is then formed via ion implantation and annealing in an upper portion of a copper or copper alloy present in the opening. The upper portion of the copper or copper alloy containing the ruthenium (Ru) or osmium (Os) doped copper or copper alloy cap can mitigate or even prevent preferential loss of copper which can aid in lowering the interconnect resistance of the structure.

In one aspect of the present application, a semiconductor structure is provided. In one embodiment of the present application, the semiconductor structure may include an interconnect dielectric material layer containing an opening and located on a surface of a substrate. The opening that is present in the interconnect dielectric material layer contains a continuous diffusion barrier liner lining the opening, a continuous reflow enhancement liner on the diffusion barrier liner, and an interconnect structure filling a remaining volume of the opening. The interconnect structure comprises, from bottom to top, a copper or copper alloy and a ruthenium (Ru) or osmium (Os) doped copper or copper alloy cap. The ruthenium (Ru) or osmium (Os) doped copper or copper alloy cap has a topmost surface that is coplanar with a topmost surface of the interconnect dielectric material layer.

In another aspect of the present application, a method of forming a semiconductor structure is provided. In one embodiment of the present application, the method may include providing an opening in an interconnect dielectric material layer. Next, a diffusion barrier material is formed in the opening and on a topmost surface of the interconnect dielectric material layer, followed by the formation of a reflow enhancement layer on the diffusion barrier layer. Copper or a copper alloy is then formed on the reflow enhancement layer. Next, a ruthenium (Ru) or osmium (Os) doped copper or copper alloy cap is formed in an upper portion of the copper or copper alloy. Portions of the diffusion barrier material, the reflow enhancement layer, and the copper or copper alloy that are located outside the opening and on the topmost surface of the interconnect dielectric material are removed, while maintaining the Ru or Os doped copper or copper alloy cap on a remaining portion of the copper or copper alloy in the opening.

DETAILED DESCRIPTION

Figure 1:
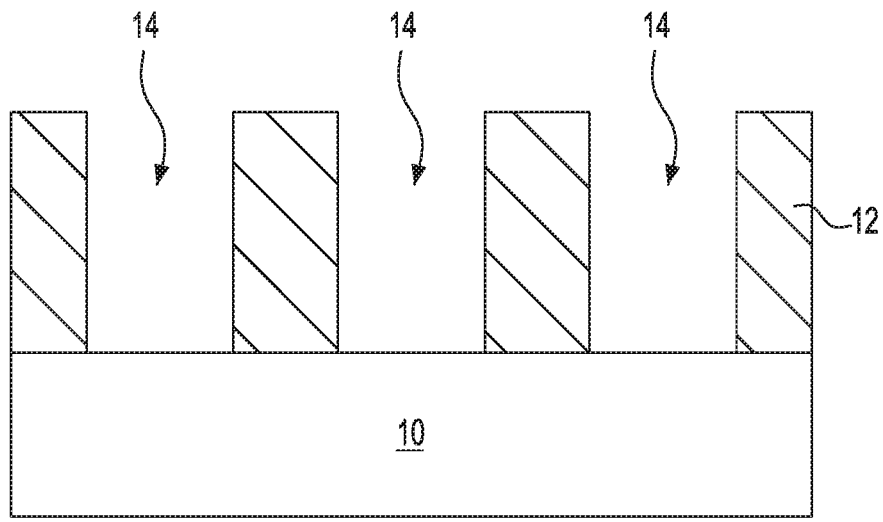
FIG. 1 is a cross sectional view of an exemplary semiconductor structure including a plurality of openings formed in an interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. The exemplary semiconductor structure shown in FIG. 1 includes a plurality of openings 14 formed in an interconnect dielectric material layer 12. Although a plurality of openings 14 is described and illustrated, the present application works when a single opening 14 is formed into the interconnect dielectric material layer 12. Each opening 14 exposes at least sidewall surfaces of the interconnect dielectric material layer 12.

As is shown, the interconnect dielectric material layer 12 is formed on a substrate 10. The substrate 10 that can be employed in the present application may be composed of a semiconductor material, an insulator material, a conductive material or any combination thereof. When the substrate 10 is composed of a semiconductor material, any material having semiconducting properties such as, for example, Si, SiGe, SiGeC, SiC, Ge, III/V compound semiconductors or II/VI compound semiconductors, may be used. In addition to these listed types of semiconductor materials, the substrate 10 can be a layered semiconductor such as, for example, Si/SiGe, Si/SiC, silicon-on-insulators (SOIs) or silicon germanium-on-insulators (SGOIs).

When the substrate 10 is an insulator material, the insulator material can be an organic insulator, an inorganic insulator or any combination thereof including multilayers. When the substrate 10 is a conductive material, the substrate may include, for example, polySi, an elemental metal, alloys of elemental metals, a metal silicide, a metal nitride or any combination thereof including multilayers.

When the substrate 10 is composed of a semiconductor material, one or more semiconductor devices such as, for example, complementary metal oxide semiconductor (CMOS) devices can be fabricated thereon. When the substrate 10 is composed of a combination of an insulator material and a conductive material, the substrate 10 may represent an underlying interconnect level of a multilayered interconnect structure.

The interconnect dielectric material layer 12 that is employed in the present application may be composed of any interlevel or intralevel dielectric including inorganic dielectrics or organic dielectrics. In one embodiment, the interconnect dielectric material layer 12 may be non-porous. In another embodiment, the interconnect dielectric material layer 12 may be porous. Some examples of suitable dielectrics that can be used as the interconnect dielectric material layer 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material layer 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material layer 12 may vary depending upon the type of dielectric material(s) used. In one example, the interconnect dielectric material layer 12 may have a thickness from 50 nm to 1000 nm. Other thicknesses that are lesser than, or greater than, the aforementioned thickness range may also be employed in the present application for the thickness of interconnect dielectric material layer 12.

The at least one opening 14 that is formed into the interconnect dielectric material layer 12 can be formed utilizing a patterning process. In one embodiment, the patterning process may include lithography and etching. The lithographic process includes forming a photoresist (not shown) atop the interconnect dielectric material layer 12, exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening 14.

In some embodiments and as illustrated in FIG. 1, each opening 14 may have a same width and a same depth. In one example, the depth of each opening 14 may extend entirely through the interconnect dielectric material layer 12 and expose a portion of a topmost surface of the substrate 10. In another example, the depth of each opening 14 may stop within the interconnect dielectric material layer 12 itself. In other embodiments, a first set of openings may have a first width and/or a first depth and a second set of openings may have a second width and/or second depth that is different from the first width and/or first depth.

Figure 2:
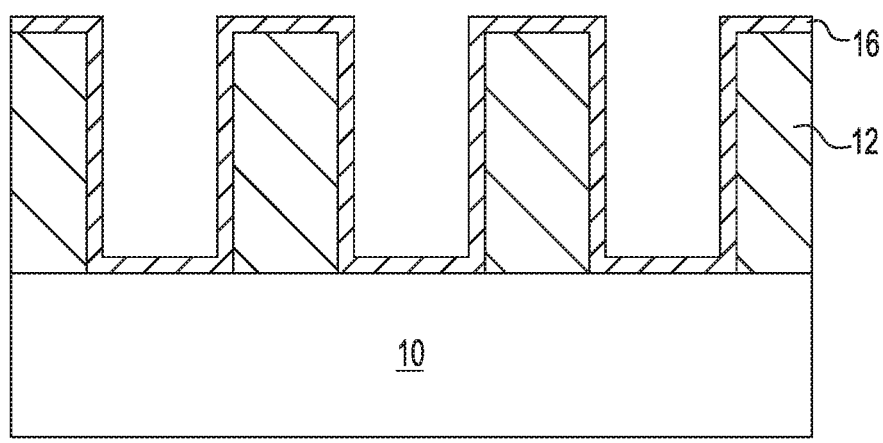
FIG. 2 is a cross sectional view of the exemplary semiconductor structure of FIG. 1 after forming a diffusion barrier material.

Referring now to FIG. 2, there is illustrated the exemplary semiconductor structure of FIG. 1 after forming a diffusion barrier material 16. As is shown, the diffusion barrier material 16 is formed as a continuous (i.e., without breaks or voids) layer on the exposed topmost surface of the interconnect dielectric material layer 12 and along the sidewall surfaces and bottommost surface of each opening 14.

The diffusion barrier material 16 includes Ta, TaN, Ti, TiN, Ru, RuN, RuTa, RuTaN, W, WN or any other material that can serve as a barrier to prevent a conductive material such as copper from diffusing there through. In some embodiments, the diffusion barrier material 16 may include a material stack of such diffusion barrier materials. In one example, the diffusion barrier material 16 may be composed of a stack of Ta/TaN.

The thickness of the diffusion barrier material 16 may vary depending on the deposition process used as well as the material employed. In some embodiments, the diffusion barrier material 16 may have a thickness from 2 nm to 50 nm; although other thicknesses for the diffusion barrier material 16 are contemplated and can be employed in the present application. The diffusion barrier material 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 3:
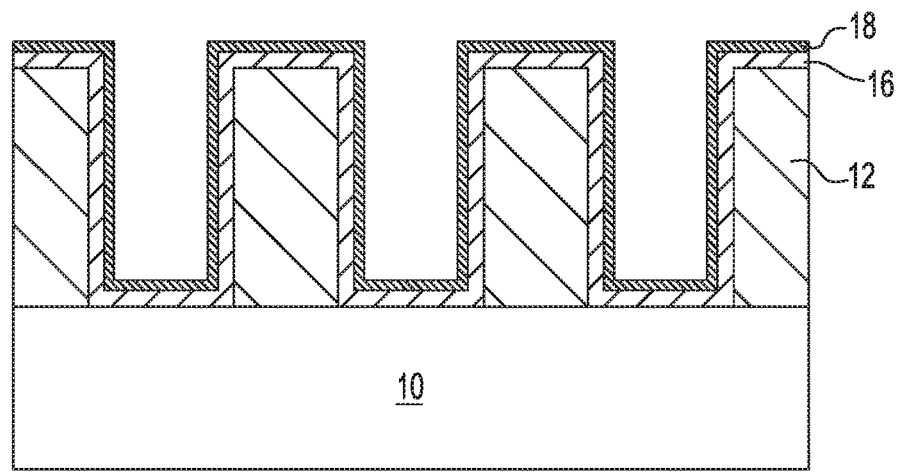
FIG. 3 is a cross sectional view of the exemplary semiconductor structure of FIG. 2 after forming a reflow enhancement layer.

Referring now to FIG. 3, there is illustrated the exemplary semiconductor structure of FIG. 2 after forming a reflow enhancement layer 18. As is shown, the reflow enhancement layer 18 is formed as a continuous (i.e., without breaks or voids) layer on the diffusion barrier material 16. The reflow enhancement layer 18 is present in each of the openings 14 and is located above a topmost surface of the interconnect dielectric material layer 12.

The reflow enhancement layer 18 includes a metal that can, in some embodiments, facilitate in the movement (i.e., flow) of another deposited metal or metal alloy that differs in composition from the reflow enhancement layer 18 during a subsequently performed reflow anneal process. In the present application, the reflow enhancement layer 18 includes ruthenium (Ru) or osmium (Os). The thickness of reflow enhancement layer 18 may vary depending on the material of the reflow enhancement layer 18 as well as the technique used in forming the same. Typically, the reflow enhancement layer 18 has a thickness from 2 nm to 80 nm. The reflow enhancement layer 18 can be formed by a conventional deposition process including, for example, CVD, PECVD, ALD, or PVD. It is noted that the total thickness of the diffusion barrier material 16 and the reflow enhancement layer 18 is insufficient to completely fill the total volume of each opening 14. Thus, a portion (i.e., volume) of each opening 14 is available for further processing.

Figure 4:
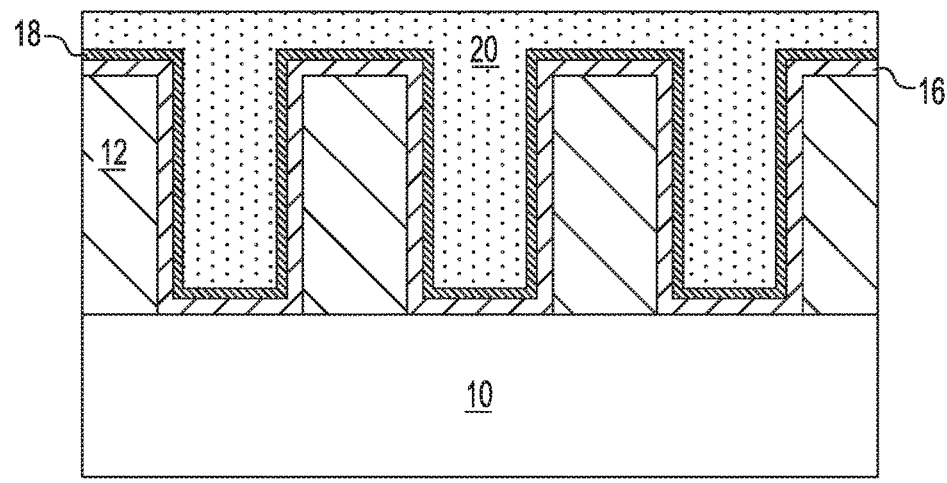
FIG. 4 is a cross sectional view of the exemplary semiconductor structure of FIG. 3 after depositing copper or a copper alloy.

Referring now to FIG. 4, there is illustrated the exemplary semiconductor structure of FIG. 3 after forming copper or a copper alloy 20. In some embodiments, pure copper metal is formed, while in other embodiments a copper alloy such as copper-aluminum, is formed. As is shown, the copper or copper alloy 20 is formed on the reflow enhancement layer 18 and fills a remaining volume of each of the openings 14; an overburdened portion of the copper or copper alloy 20 extends outside each of the openings 14.

In one embodiment of the present application, the copper or copper alloy 20 can be formed utilizing any conventional electroplating process. In such an embodiment, and prior to electroplating the copper or copper alloy 20, a plating seed layer (not specifically shown) can be formed on the surface of the reflow enhancement layer 18. The plating seed layer is also a continuous layer. The plating seed layer is employed to selectively promote subsequent electroplating of copper (Cu) or a copper (Cu) alloy. The plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal or copper alloy is to be subsequently formed. The thickness of the plating seed layer may vary depending on the material of the optional plating seed layer as well as the technique used in forming the same. Typically, the plating seed layer has a thickness from 2 nm to 80 nm. The plating seed layer can be formed by a conventional deposition process including, for example, CVD, PECVD, ALD, or PVD.

In another embodiment of the present application, the copper or copper alloy 20 can be formed by physical vapor deposition, followed by a reflow anneal. In one embodiment of the present application, the reflow anneal is a thermal anneal. In one example, the reflow anneal may include a furnace anneal or a hot plate anneal. The reflow anneal may be performed at a temperature from 100° C. to 500° C. Other temperatures can also be employed so long as the selected reflow anneal temperature causes the reflow of Cu or a Cu alloy. The duration of the reflow anneal may vary depending upon the temperature used during the thermal anneal. In one embodiment and for a temperature from 100° C. to 500° C., the reflow anneal may be performed for a duration of 20 minutes to 3 hours.

The reflow anneal is typically performed in a nitrogen-containing ambient or a hydrogen-containing ambient. The nitrogen-containing ambients that can be employed in the present application include, but are not limited to, $N_2$, or $NH_3$, and mixtures thereof. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient. Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical.

In either embodiment, a planarization process may be performed to provide a slight overburden and a planar topmost surface to the copper or copper alloy 20 as shown in FIG. 4. In one example, the planarization process may be performed utilizing chemical mechanical polishing (CMP).

Figure 5:
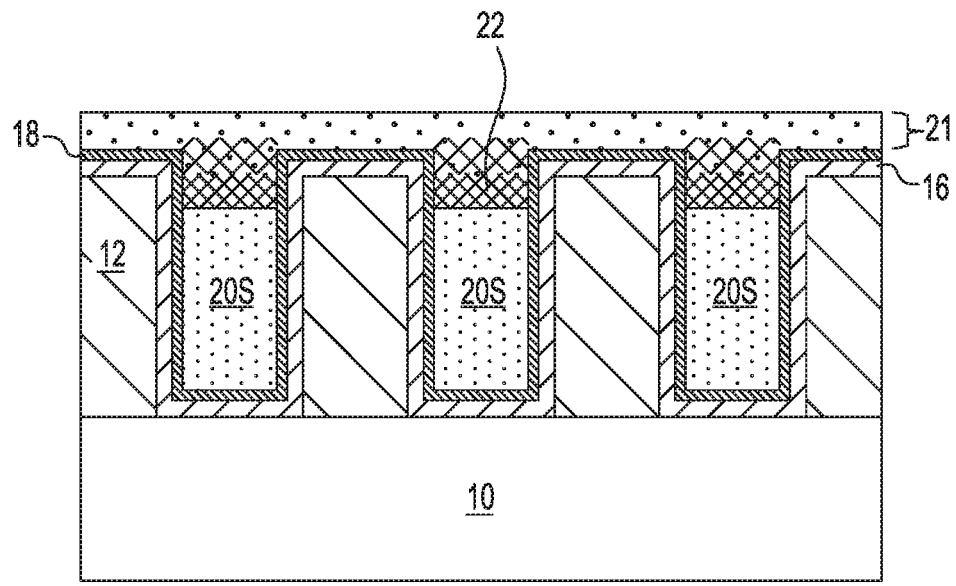
FIG. 5 is a cross sectional view of the exemplary semiconductor structure of FIG. 4 after implanting ruthenium (Ru) or osmium (Os) into an upper portion of the copper or copper alloy and performing an anneal.

Referring now to FIG. 5, there is illustrated the exemplary semiconductor structure of FIG. 4 after ion implanting ruthenium (Ru) or osmium (Os) into an upper portion of the copper or copper alloy 20 and performing an anneal. This step of the present application provides a ruthenium (Ru) or osmium (Os) doped copper or copper alloy cap region 22 (i.e., an Ru or Os enriched copper or copper alloy region) that separates an overburden copper or copper alloy region 21 that may include some or no Ru or Os dopant regions, and a remaining portion of the copper or copper alloy that contains no Ru or Os dopant. The remaining undoped portion of copper or copper alloy is labeled as element 20S in the drawings. The ruthenium (Ru) or osmium (Os) doped copper or copper alloy cap region 22 contains one of Ru and Os as a dopant and copper or a copper-alloy. In one example, the ruthenium (Ru) or osmium (Os) doped copper or copper alloy cap region 22 comprises Ru-doped Cu. In another example, the ruthenium (Ru) or osmium (Os) doped copper or copper alloy cap region 22 comprises Os-doped Cu.

The concentration of Ru or Os that is present in the ruthenium (Ru) or osmium (Os) doped copper or copper alloy cap region 22 can be from 5E20 atoms/cm$^3$ to 5E21 atoms/cm$^3$. Other concentrations of Ru or Os are possible and are not excluded from being used in the present application.

In one embodiment, and when the reflow enhancement layer 18 is composed of Ru, Ru is introduced into the upper portion of the copper or copper alloy forming a Ru doped copper or copper alloy cap region 22. In another embodiment, and when the reflow enhancement layer 18 is composed of Os, Os is introduced into the copper or copper alloy forming a Os doped copper or copper alloy cap region 22. In either embodiment, no Ru or Os is introduced into the interconnect dielectric layer 12.

In some embodiments of the present application, the Ru or Os doped copper or copper alloy cap region 22 has a graded Ru or Os concentration. In one embodiment of the present application, the graded Ru or Os concentration decreases from a topmost surface of the Ru or Os doped copper or copper alloy cap region 22 to a bottommost surface of the Ru or Os doped copper or copper alloy cap region 22. In other embodiments of the present application, the Ru or Os doped copper or copper alloy cap region 22 has a constant Ru or Os concentration from a topmost surface of the Ru or Os doped copper or copper alloy cap region 22 to a bottommost surface of the Ru or Os doped copper or copper alloy cap region 22.

As mentioned above, the ruthenium (Ru) or osmium (Os) doped copper or copper alloy cap region 22 is formed by ion implantation and annealing. Any ion implantation process that can introduce Ru or Os into an upper portion of a copper or copper alloy can be used in the present application. The ion implantation conditions employed in the present application can be selected from well known conditions. The anneal that is performed includes an anneal that can cause the Ru or Os ions to migrate and pile-up in an upper portion of a copper or copper alloy 20. In one example, the anneal may be performed at a temperature from 100° C. to 300° C. and in an inert ambient such as, for example, helium and/or argon.

Figure 6:
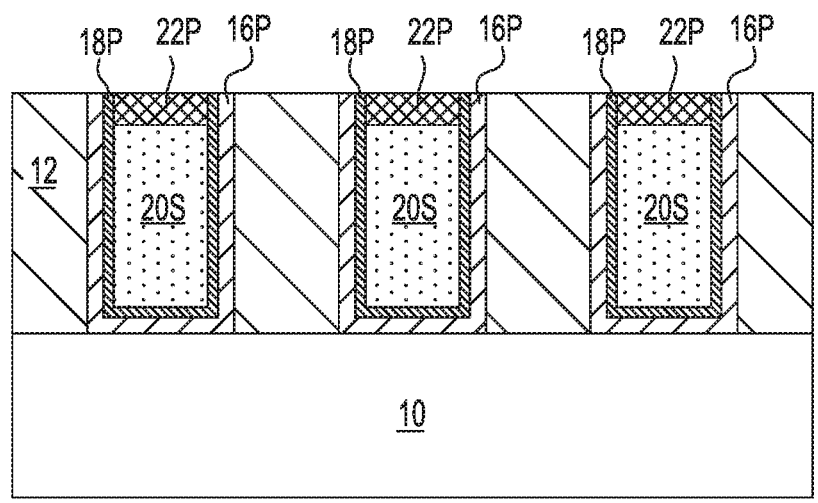
FIG. 6 is a cross sectional view of the exemplary semiconductor structure of FIG. 5 after performing a planarization process.

Referring now to FIG. 6, there is illustrated the exemplary semiconductor structure of FIG. 5 after performing a planarization process. The planarization process removes portions of the diffusion barrier material 16, the reflow enhancement layer 18, and the overburdened copper or copper alloy region 21 that are located outside each opening 14 and on the topmost surface of the interconnect dielectric material 12; an upper portion of the Ru or Os doped copper or copper alloy cap region 22 may or may not be removed during this planarization process.

As is shown, portions of the diffusion barrier material 16 and portions of the reflow enhancement layer 18 remain in each opening 14. Each remaining portion of the diffusion barrier material 16 may be referred to herein as a continuous diffusion barrier liner 16P. Each remaining portion of the reflow enhancement layer 18 may be referred to herein as a continuous reflow enhancement liner 18P. Also present in each opening is, the Ru or Os doped copper or copper alloy cap region 22 or a remaining portion of the Ru or Os doped copper or copper alloy cap region 22 (now referred to merely as a Ru or Os doped copper or copper alloy cap 22P) and the undoped portion of copper or copper alloy 20S. Collectively, the combination of the copper or copper alloy portion 20S and the Ru or Os doped copper or copper alloy cap 22P present in each opening 14 may be referred to herein as an interconnect structure. Planarization may be performed utilizing one of chemical mechanical polishing (CMP) and/or grinding.

FIG. 6 illustrates an exemplary semiconductor structure in accordance with the present application. The exemplary semiconductor includes an interconnect dielectric material layer 12 containing an opening 14 and located on a surface of a substrate 10. The opening 14 that is present in the interconnect dielectric material layer 12 contains a continuous diffusion barrier liner 16P lining the opening 14, a continuous reflow enhancement liner 18P located on the diffusion barrier liner 16P, and an interconnect structure (20S, 22P) filling a remaining volume of the opening 14. The interconnect structure (20S, 22P) comprises, from bottom to top, a copper or copper alloy 20S and a ruthenium (Ru) or osmium (Os) doped copper or copper alloy cap 22P. As is shown, the ruthenium (Ru) or osmium (Os) doped copper or copper alloy cap 22P has a topmost surface that is coplanar with a topmost surface of the interconnect dielectric material layer 12. The topmost surface of the ruthenium (Ru) or osmium (Os) doped copper or copper alloy cap 22P is also coplanar with a topmost surface of each of the continuous diffusion barrier liner 16P and the continuous reflow enhancement liner 18P. As is further shown, the Ru or Os doped copper or copper alloy cap 22P is present on an entire topmost surface of the copper or copper alloy 22S, and the copper or copper alloy 20S contains no voids. The presence of the Ru or Os doped copper or copper alloy cap 22P aids in the mitigation or even, in some embodiments, prevents galvanic loss of copper from the structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   providing an opening in an interconnect dielectric material layer;
   forming a diffusion barrier material in the opening and on a topmost surface of the interconnect dielectric material layer;
   forming a reflow enhancement layer on the diffusion barrier layer;
   forming copper or a copper alloy on the reflow enhancement layer;
   forming a ruthenium (Ru) or osmium (Os) doped copper or copper alloy cap in an upper portion of the copper or copper alloy; and
   removing portions of the diffusion barrier material, the reflow enhancement layer, and the copper or copper alloy that are located outside the opening and on the topmost surface of the interconnect dielectric material layer, while maintaining the Ru or Os doped copper or copper alloy cap on a remaining portion of the copper or copper alloy in the opening.

2. The method of claim 1, wherein the forming the ruthenium (Ru) or osmium (Os) doped copper or copper alloy cap comprises:
   implanting ruthenium (Ru) or osmium (Os) into the upper portion of the copper or copper alloy; and
   annealing.

3. The method of claim 2, wherein the annealing is performed at a temperature from 100° C. to 300° C.

4. The method of claim 2, wherein no ruthenium (Ru) or osmium (Os) is introduced into the interconnect dielectric material layer during the implanting of ruthenium (Ru) or osmium (Os) into the upper portion of the copper or copper alloy.

5. The method of claim 1, wherein the reflow enhancement layer comprises ruthenium (Ru) and a ruthenium (Ru) doped copper or copper alloy cap is formed.

6. The method of claim 1, wherein the reflow enhancement layer comprises osmium (Os) and a osmium (Os) doped copper or copper alloy cap is formed.

7. The method of claim 1, wherein after the removing, the Ru or Os doped copper or copper alloy cap has a topmost surface that is coplanar with the topmost surface of the interconnect dielectric material layer.

8. The method of claim 1, wherein the Ru or Os doped copper or copper alloy cap has a graded Ru or Os concentration that decreases from a topmost surface of the Ru or Os doped copper or copper alloy cap to a bottommost surface of the Ru or Os doped copper or copper alloy cap.

9. The method of claim 1, wherein the Ru or Os doped copper or copper alloy cap has a constant Ru or Os concentration from a topmost surface of the Ru or Os doped copper or copper alloy cap to a bottommost surface of the Ru or Os doped copper or copper alloy cap.

10. The method of claim 1, wherein the forming the copper or copper alloy comprises electroplating or a combination of physical vapor deposition and a reflow anneal.

11. The method of claim 1, wherein the opening extends entirely through the interconnect dielectric material layer and contacts a surface of a substrate.

12. The method of claim 1, wherein after the removing of the portions of the diffusion barrier material and portions of the reflow enhancement layer that are located outside the opening and on the topmost surface of the interconnect dielectric material layer, a portion of the diffusion barrier material and a portion of the reflow enhancement layer remain in the opening.

13. The method of claim 12, wherein the remaining diffusion barrier material in the opening and the remaining reflow enhancement layer in the opening are shaped.

14. The method of claim 13, wherein the remaining diffusion barrier material in the opening and the remaining reflow enhancement layer in the opening have topmost surfaces that are coplanar with each other.

15. The method of claim 14, wherein the topmost surfaces of the remaining diffusion barrier liner material and the remaining reflow enhancement layer in the opening are coplanar with the topmost surface of the Ru or Os doped copper or copper alloy cap and the topmost surface of the interconnect dielectric material layer.

16. The method of claim 1, wherein the ruthenium (Ru) or osmium (Os) doped copper or copper alloy cap has a bottommost surface that contacts an entirety of a topmost surface of the copper or a copper alloy.

17. The method of claim 1, wherein the remaining portion of the copper or copper alloy in the opening contains no voids.

18. The method of claim 1, wherein the ruthenium (Ru) or osmium (Os) doped copper or copper alloy cap mitigates galvanic loss of copper.

19. The method of claim 1, wherein the removing comprises a planarization process.

* * * * *